US012760774B2

(12) United States Patent
Meckel et al.

(10) Patent No.: US 12,760,774 B2
(45) Date of Patent: Oct. 13, 2026

(54) METHOD OF INSIGNIA APPLICATION TO BRAKE ROTORS

(71) Applicant: Tech M3, Inc., Poway, CA (US)

(72) Inventors: Nathan K. Meckel, Ramona, CA (US); Gordon M. Heidacker, Clarkston, MI (US); Shaun Visser, Goodrich, MI (US)

(73) Assignee: Tech M3, Inc., Poway, CA (US)

( * ) Notice: Subject to any disclaimer, the term of this patent is extended or adjusted under 35 U.S.C. 154(b) by 459 days.

(21) Appl. No.: 18/372,396

(22) Filed: Sep. 25, 2023

(65) Prior Publication Data

US 2024/0011535 A1 Jan. 11, 2024

Related U.S. Application Data

(60) Continuation-in-part of application No. 18/122,806, filed on Mar. 17, 2023, now Pat. No. 12,025,195,
(Continued)

(51) Int. Cl.
*F16D 65/12* (2006.01)
*C23C 14/02* (2006.01)
(Continued)

(52) U.S. Cl.
CPC .......... *F16D 65/127* (2013.01); *C23C 14/021* (2013.01); *C23C 14/025* (2013.01);
(Continued)

(58) Field of Classification Search
CPC ...... F16D 65/12; F16D 65/127; F16D 69/027; F16D 2065/132; F16D 2069/005;
(Continued)

(56) References Cited

U.S. PATENT DOCUMENTS 5,407,035 A * 4/1995 Cole .................... F16D 65/127 188/218 XL
5,501,306 A 3/1996 Martino
(Continued)

FOREIGN PATENT DOCUMENTS

JP 2004316850 A 11/2004

OTHER PUBLICATIONS

PCT International Search Report & Written Opinion dated Jan. 24, 2024, Application No. PCT/US2023/033618.

*Primary Examiner* — Thomas W Irvin
(74) *Attorney, Agent, or Firm* — The Dobrusin Law Firm, P.C.

(57) ABSTRACT

An etched logo is provided at a location within the layers. This etched section is viewable to the user on the working surface as a form of insignia (logo, trademark, letters, words, serial numbers, designs, patters, artwork, and the like) and does not wear off in normal use because of the coating layers and. Alternatively, the etching (or other slight indentation) may penetrate the 26 while still being viewable in the finished product to display the insignia. Even further, the etching may extend through the coating layers and the substrate. In this particular embodiment, the substrate includes a surface texture (also a form of insignia) viewable to a person in the finished product.

2 Claims, 10 Drawing Sheets

Related U.S. Application Data which is a continuation-in-part of application No. 17/181,670, filed on Feb. 22, 2021, and a continuation of application No. 14/711,661, filed on May 13, 2015, now abandoned, and a continuation of application No. 13/336,986, filed on Dec. 23, 2011, now abandoned, and a division of application No. 12/034,590, filed on Feb. 20, 2008, now Pat. No. 8,084,089.

(60) Provisional application No. 63/409,267, filed on Sep. 23, 2022, provisional application No. 60/971,879, filed on Sep. 12, 2007, provisional application No. 60/957,422, filed on Aug. 22, 2007, provisional application No. 60/890,790, filed on Feb. 20, 2007.

(51) Int. Cl.

| | |
|---|---|
| ***C23C 14/06*** | (2006.01) |
| ***C23C 14/08*** | (2006.01) |
| ***C23C 14/14*** | (2006.01) |
| ***C23C 14/32*** | (2006.01) |
| ***C23C 14/35*** | (2006.01) |
| ***C23C 14/50*** | (2006.01) |
| ***F16D 69/02*** | (2006.01) |
| *F16D 65/02* | (2006.01) |
| *F16D 69/00* | (2006.01) |

(52) U.S. Cl.
CPC ........ *C23C 14/028* (2013.01); *C23C 14/0635* (2013.01); *C23C 14/0641* (2013.01); *C23C 14/08* (2013.01); *C23C 14/14* (2013.01); *C23C 14/325* (2013.01); *C23C 14/35* (2013.01); *C23C 14/505* (2013.01); *F16D 65/12* (2013.01); *F16D 69/027* (2013.01); *F16D 2065/132* (2013.01); *F16D 2069/005* (2013.01); *F16D 2200/0078* (2013.01); *F16D 2250/0046* (2013.01)

(58) Field of Classification Search
CPC ..... F16D 2200/0078; F16D 2250/0046; F16D 2250/003; C23C 14/021; C23C 14/025; C23C 14/028; C23C 14/0635; C23C 14/0641; C23C 14/08; C23C 14/14; C23C 14/325; C23C 14/35; C23C 14/505
See application file for complete search history.

(56) References Cited

U.S. PATENT DOCUMENTS

| | | | | |
|---|---|---|---|---|
| 6,457,566 | B1 * | 10/2002 | Toby | F16D 65/12<br>188/218 XL |
| 6,561,322 | B2 * | 5/2003 | Kurita | F01L 1/16<br>188/251 M |
| 2002/0153210 | A1 * | 10/2002 | Kurita | F01L 1/18<br>29/888.048 |
| 2002/0153214 | A1 * | 10/2002 | Bauer | F16D 66/02<br>188/251 A |
| 2003/0030320 | A1 * | 2/2003 | Smith | B60B 7/0053<br>301/37.42 |
| 2005/0087406 | A1 * | 4/2005 | Meckel | F16D 65/12<br>188/71.1 |
| 2005/0252739 | A1 * | 11/2005 | Callahan | F16D 65/12<br>188/218 XL |
| 2006/0042886 | A1 * | 3/2006 | Peters | B60Q 1/326<br>188/1.11 W |
| 2008/0041675 | A1 * | 2/2008 | Baumgartner | F16D 65/12<br>188/218 XL |
| 2008/0196985 | A1 | 8/2008 | Meckel | |
| 2009/0026025 | A1 * | 1/2009 | Hampton | F16D 65/127<br>188/218 XL |

* cited by examiner

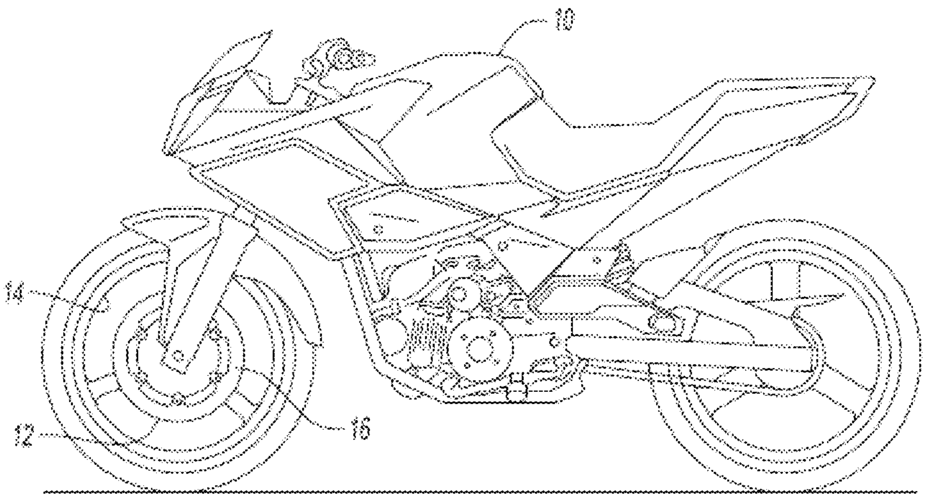
Fig-1
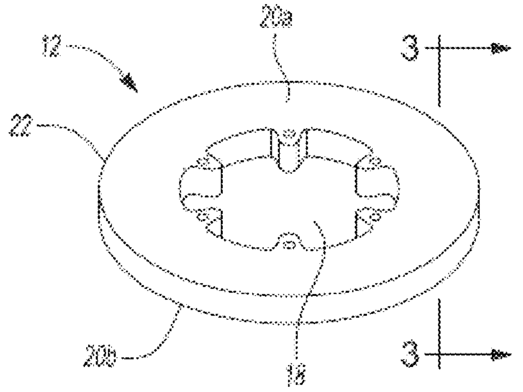
Fig-2
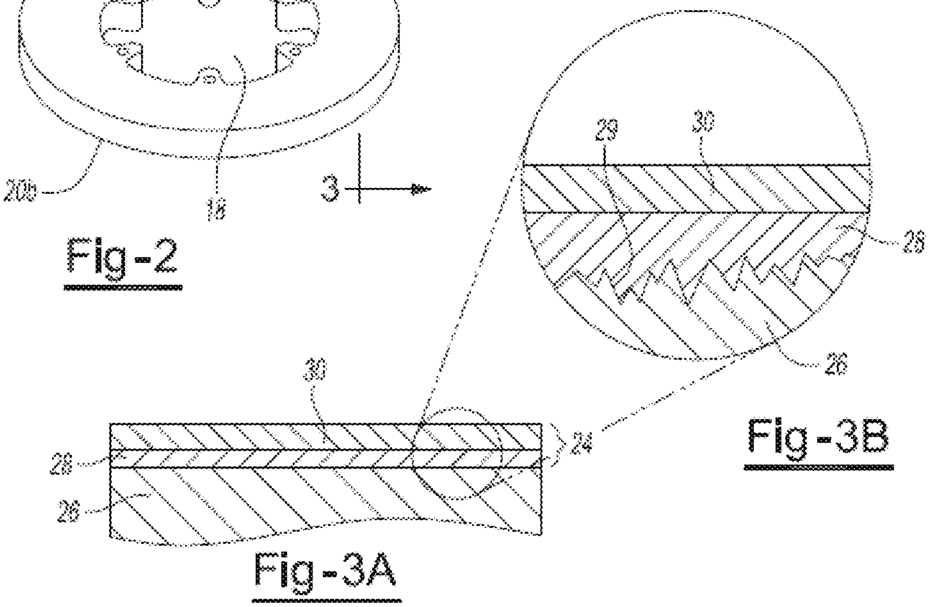
Fig-3B
Fig-3A

METHOD OF INSIGNIA APPLICATION TO BRAKE ROTORS

CROSS REFERENCE TO RELATED APPLICATIONS

This application claims priority and benefit to Provisional Patent Application Ser. No. 63/409,267 filed Sep. 23, 2022, is a continuation-in-part application of U.S. patent application Ser. No. 18/122,806 filed on Mar. 17, 2023 which claims the benefit of U.S. provisional patent application No. 60/957,422, filed Aug. 22, 2007 and U.S. provisional patent application No. 60/971,879, filed Sep. 12, 2007, and is a continuation-in-part application of U.S. patent application Ser. No. 17/181,670 filed on Feb. 22, 2021 which is a continuation of U.S. patent application Ser. No. 14/711,661, filed May 13, 2015, titled "Wear Resistant Coating For Brake Disks With Unique Surface Appearance and Methods For Coating;" which in turn is a continuation of U.S. patent application Ser. No. 13/336,986, filed Dec. 23, 2011, titled "Wear Resistant Coating For Brake Disks With Unique Surface Appearance and Methods For Coating;" which in turn is a divisional of U.S. patent application Ser. No. 12/034,590, filed on Feb. 20, 2008 and issued as U.S. Pat. No. 8,084,089 on Dec. 27, 2011, which claims priority under 35 U.S.C. § 119(e) to U.S. Provisional Patent Application Ser. No. 60/890,790, filed Feb. 20, 2007, all of which are incorporated herein by reference in their entirety.

TECHNICAL FIELD

The subject matter described herein relates to braking systems and more particularly to a system and method for equipping a vehicle with braking systems. The subject matter described herein relates to reducing particulate emissions from the braking systems of vehicles. For the purposes of this disclosure, the term "vehicle" includes, but is not limited to, automobiles, motorcycles, motorized scooters, on and off-road vehicles electric vehicles such as golf carts, light and heavy-duty trucks, road tractors and semi-trailers, vans, off-road vehicles such as all-terrain vehicles and dune-buggies, trains, and the like. The subject matter disclosed herein is also applicable to braking systems used with aircraft landing gear, bicycles, military vehicles, and the like and specifically application of logos, words, numbers, graphics, images, patters, designs, and the like onto brake rotors.

BACKGROUND

During braking, hydraulic energy is used to press the vehicle's brake pads against the rotating brake disk. The friction resulting from the moving contact between brake pad and brake disk slows the rotation of the brake disk and decreases the speed of the vehicle. This frictional contact generates heat and causes the contact surfaces on the brake pad and brake disk to wear unevenly. Excessive wear can cause the brake disk to become thin and weak resulting in warpage and brake fade. In some cases, the thinning of the brake disk becomes so severe that the brake disk is no longer able to support the stresses and heat generated during braking. The result is typically a warped brake disk that can cause undesirable brake chattering and an unsafe brake system.

A factor that can be considered when designing brake rotors is aesthetics. Modern motorcycles have rather large diameter brake disks that are plainly visible, especially the front disk(s). Because of this visibility, the color and surface appearance of a brake disk can add to or detract from the overall look of the motorcycle. These considerations can affect a purchaser's decision when buying a new motorcycle and also when retrofitting a motorcycle with a new brake system.

In view of the foregoing, there are a number of reasons why it is important for a brake disk (also sometimes referred to as a brake rotor) to dissipate heat while at the same time to be wear and corrosion resistant. First, the ability of the brake disk to dissipate heat helps eliminate the possibility of brake fade, wear and subsequent warpage. This, in turn, would potentially lead to a longer service life for the brake rotor. A longer service life translates into reduced maintenance and the associated costs. Additionally, the ability of the brake disk to dissipate heat faster would result in less brake fade which would add to the safety aspects of the overall braking system. A final consideration, which is especially important for brake disks used on motorcycles (or wherever the brake disk is exposed to general view), is the appearance of the brake disk.

There are a number of reasons why it is important for a brake disk (also sometimes referred to as a brake rotor) to be wear and corrosion resistant while at the same time looking aesthetically pleasing. First, the ability of the brake disk to resist wear leads to a longer service life. A longer service life translates into reduced maintenance and the associated maintenance costs. Additionally, the ability of the brake disk to resist corrosion adds to the life and the overall appearance of the brake disk. Another consideration for brake disks used on motorcycles (or wherever the brake disk is exposed to general view), is the appearance of the brake disk.

During braking, hydraulic or mechanical energy is used to press the vehicle's brake pads against the rotating brake disk. The friction resulting from the moving contact between brake pad and brake disk slows the rotation of the brake disc and decreases the speed of the vehicle. This frictional contact generates heat and causes the contact surfaces on the brake pad and brake disk to wear unevenly. Excessive wear can cause the brake disk to become thin and weak. In some cases, the thinning of the brake disk becomes so severe that the brake disk is no longer able to support the stresses and heat generated during braking. The result is typically a warped brake disk that can cause undesirable brake chattering.

A final factor that must be considered when designing brake rotors is aesthetics. Modern motorcycles have rather large diameter brake disks that are plainly visible, especially the front disk. Because of this visibility, the color and surface appearance of a brake disk can add to or detract from the overall look of the motorcycle. These considerations can affect a purchaser's decision when buying a new motorcycle and when retrofitting a motorcycle with a new brake system.

In light of the above, it is an object of the present invention to provide cast iron, carbon steel, stainless steel, and light weight ceramic composite brake disks that are coated with a material that is wear and corrosion resistant.

There are a number of reasons why it is important for a brake disk (also sometimes referred to as a brake rotor) to be wear and corrosion resistant while at the same time looking aesthetically pleasing. First, the ability of the brake disk to resist wear leads to a longer service life. A longer service life translates into reduced maintenance and the associated maintenance costs. Additionally, the ability of the brake disk to resist corrosion adds to the life and the overall appearance of the brake disk. Another consideration for brake disks used on motorcycles (or wherever the brake disk is exposed to general view), is the appearance of the brake disk.

During braking, hydraulic or mechanical energy is used to press the vehicle's brake pads against the rotating brake disk. The friction resulting from the moving contact between brake pad and brake disk slows the rotation of the brake disc and decreases the speed of the vehicle. This frictional contact generates heat and causes the contact surfaces on the brake pad and brake disk to wear unevenly. Excessive wear can cause the brake disk to become thin and weak. In some cases, the thinning of the brake disk becomes so severe that the brake disk is no longer able to support the stresses and heat generated during braking. The result is typically a warped brake disk that can cause undesirable brake chattering.

A final factor that must be considered when designing brake rotors is aesthetics. Modern motorcycles have rather large diameter brake disks that are plainly visible, especially the front disk. Because of this visibility, the color and surface appearance of a brake disk can add to or detract from the overall look of the motorcycle. These considerations can affect a purchaser's decision when buying a new motorcycle and when retrofitting a motorcycle with a new brake system.

Further, it is undesirable to apply logos or other insignia to brake rotors since said insignia very rapidly wears off. Accordingly, there exists a need in the art to provide an improved insignia application method overcoming the aforementioned disadvantages.

SUMMARY

An etched logo is provided at a location within the layers. This etched section is viewable to the user on the working surface as a form of insignia (logo, trademark, letters, words, serial numbers, designs, patters, artwork, and the like) and does not wear off in normal use because of the coating layers and. Alternatively, the etching (or other slight indentation) may penetrate the 26 while still being viewable in the finished product to display the insignia. Even further, the etching may extend through the coating layers and the substrate. In this particular embodiment, the substrate includes a surface texture (also a form of insignia) viewable to a person in the finished product.

A method including surface finishing at least a portion of two parallel surfaces of a brake disk to impart a predetermined three-dimensional surface texture having peaks, valleys and angular surfaces between the peaks and valleys to at least the portion of the two parallel surfaces, etching insignia onto at least one of the surfaces of the brake disk, applying a first material to an area comprising at least the portion of the parallel surfaces through vapor deposition, wherein the first material is deposited onto the area by energizing a first material source to cause charged particles of the first material source to be dissociated from the first material source and deposited on the area, and applying a second compound to the area through vapor deposition, the applying comprising energizing a second material source to cause charged particles of the second material source to be dissociated from the second material source, and reacting a reactive gas with the charged particles of the second material to form the second compound applied to the area wherein the combination of the surface finishing and the applying of the first material and the second compound causes the area of the brake disk to exhibit the predetermined three dimensional surface texture after applying the first material and the second compound.

A method including the steps of surface finishing at least a portion of two parallel surfaces of a brake disk to impart a predetermined three dimensional surface texture having peaks, valleys and angular surfaces between the peaks and valleys to at least the portion of the two parallel surfaces, applying insignia onto at least one of the surfaces of the brake disk, applying a first material to an area comprising at least the portion of the parallel surfaces through vapor deposition, wherein the first material is deposited onto the area by energizing a first material source to cause charged particles of the first material source to be dissociated from the first material source and deposited on the area, and applying a second compound to the area through vapor deposition, the applying comprising energizing a second material source to cause charged particles of the second material source to be dissociated from the second material source, and reacting a reactive gas with the charged particles of the second material to form the second compound applied to the area wherein the combination of the surface finishing and the applying of the first material and the second compound causes the area of the brake disk to exhibit the predetermined three dimensional surface texture after applying the first material and the second compound. In some embodiments, the method includes applying insignia to the at least one surface of the brake disk is done by means of etching, carving, paint, or indentation.

BRIEF DESCRIPTION OF THE DRAWINGS

The embodiments set forth in the drawings are illustrative and exemplary in nature and not intended to limit the subject matter. The following detailed description of the illustrative embodiments can be understood when read in conjunction with the following drawings, where like structure is indicated with like reference numerals and in which:

FIG. 1 is a perspective view of a motorcycle having a disk brake system according to one or more embodiments shown or described herein;

FIG. 2 is a perspective view of a coated disk brake according to one or more embodiments shown or described herein;

FIG. 3A is an enlarged cross-sectional view of a portion of the coated disk brake shown in FIG. 2 as seen along line 3-3 in FIG. 2 showing the coating layers according to one or more embodiments shown or described herein;

FIG. 3B is an enlarged cross-sectional view of the circled area of the coated surface in FIG. 3A, illustrating one embodiment of a surface texture applied to the surface of the disk substrate prior to application of the coating layers according to one or more embodiments shown or described herein;

DETAILED DESCRIPTION

Figure 4:
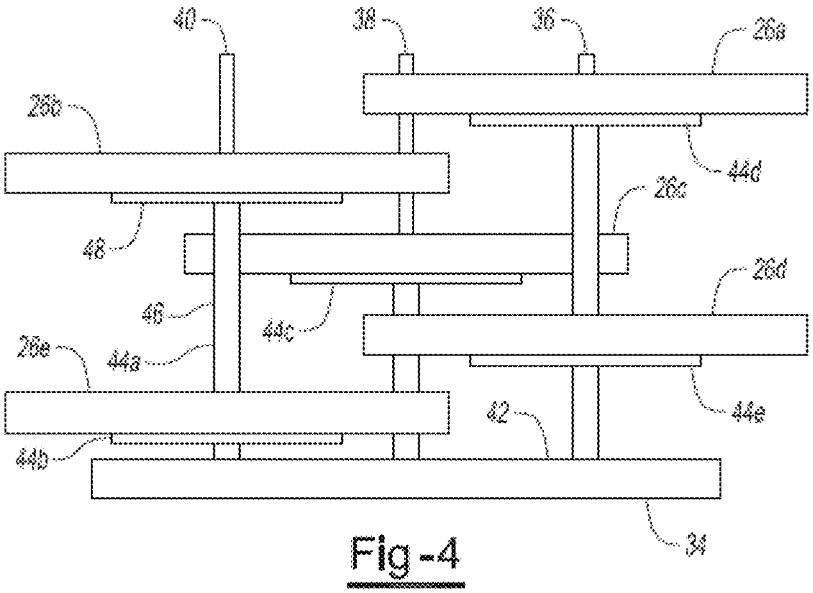
FIG. 4 is a front elevation view of a fixture for supporting the disk brakes during the coating process according to one or more embodiments shown or described herein.

Certain embodiments as disclosed herein provide for brake disks with spaced raised surface portions or island formations having an aesthetically pleasing appearance and also providing air flow channels for cooling purposes between the adjacent island formations, as well as methods for making the brake disks.

After reading this description it will become apparent to one skilled in the art how to implement the invention in various alternative embodiments and alternative applications. However, although various embodiments of the present invention are described herein, it is understood that these embodiments are presented by way of example only, and not limitation. As such, this detailed description of various alternative embodiments should not be construed to limit the scope or breadth of the present invention as set forth in the appended claims.

Referring to FIG. 1, motorcycle 10 is shown that includes a disk brake system. As shown, the disk brake system includes a brake disk or rotor 12 that is attached to the front wheel 14 of the motorcycle 10 for rotation therewith. Typically two brake disks are attached to the front wheel of a motorcycle, and one or two brake disks are attached to the rear wheel. The brake system further includes a caliper 16 having a pair of brake pads that can be selectively applied against the brake disk 12 using hydraulic pressure to slow the rotation of the brake disk 12 and wheel 14. In a typical setup, the hydraulic pressure is provided by the motorcycle operator using a hand lever mounted on the handlebars of the motorcycle 10.

A better appreciation of a brake disk 12 can be obtained with reference to FIG. 2. As shown, the brake disk 12 is disk-shaped having a central hole 18 to allow the brake disk 12 to be positioned over the hub of the wheel 14 (shown in FIG. 1). The brake disk 12 is further formed with annular working surfaces 20 *a,b* (see also FIG. 4) that extend from the central hole 18 to the periphery 22 of the brake disk 12. As shown, surface 20 *a* is parallel with and opposed to surface 20 *b* on the brake disk 12. At least a portion of each of the surfaces 20 *a,b* is designed for contact with the brake pads during braking, as described in more detail below. In one embodiment, a surface finish is applied to the annular surfaces prior to coating all or part of each surface with a wear and corrosion resistant coating, as described in more detail below.

Figure 9:
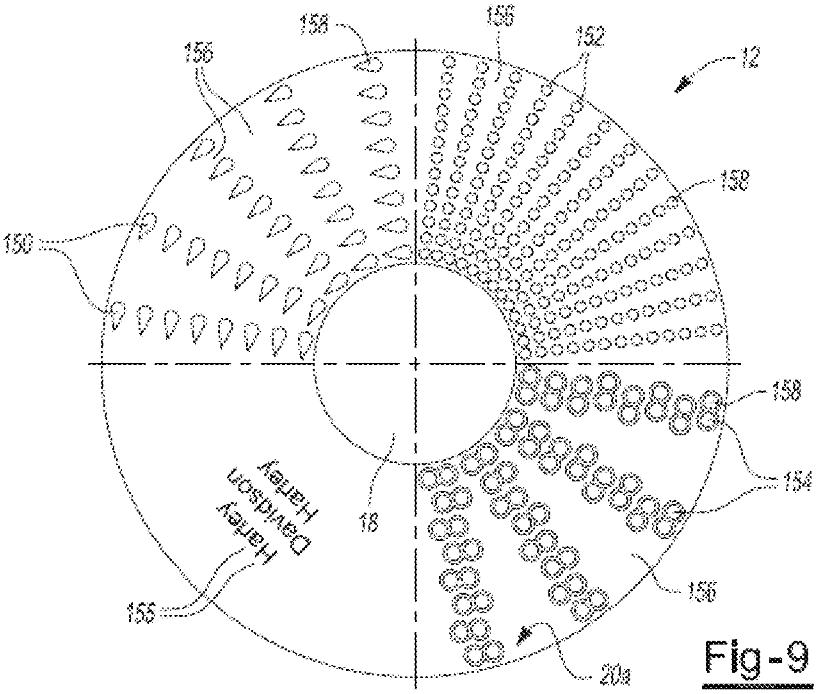
FIG. 9 is a perspective view of a brake rotor surface with four different surface modifications or "island formations" according to one or more embodiments shown or described herein.

In one embodiment, the annular surfaces 20 *a* and 20 *b* of brake disk 12 are provided with a plurality of raised land portions or island formations with spaced air flow channels between the island formations. Only the island portions contact the brake pads during braking in this arrangement, and comprise the wear surfaces of the brake disk 12. FIG. 9 illustrates some examples of possible land portions or island formations which may be provided on the opposite surfaces 20 *a* and 20 *b* of disk 12. In FIG. 9, four possible island formations are shown in the four quadrants of the exposed disc surface 20 *a*; tear drop shaped formations 150, circle or dot shaped formations 152, figure eight shaped formations 154, and letter shaped formations 155, with channels or voids 156 between the island formations allowing air flow extending between the formations. As seen in three of the quadrants in FIG. 9, the island formations may be arranged in rows which extend radially from the central opening 18 of the disk out to the peripheral edge, with radial air flow channels extending outwardly between each adjacent pair of rows, in addition to channels which extend between adjacent pairs of island formations in each row. The island formations have upper surfaces 158 which are at least substantially flat friction surfaces for contact with the brake pads during braking, and are designed with sufficient surface areas for braking purposes. The four formations illustrated in FIG. 9 are examples of suitable island formations. Alternative island formations of different shapes and sizes may be engineered for cooling and wear in order to meet specific performance criteria in addition to providing an aesthetically pleasing appearance.

In one embodiment, spaced island formations of the shape shown in any one quadrant of FIG. 9 extend over the entire disk surface. Alternatively, island formations of any desired different shapes and sizes may be provided in patterns over the disk surface. The island formations can be of any size or shape including but not limited to; letters or names, numbers, logos, trademarks, dashes, other geometric shapes, and the like. The island formations can be designed to be aesthetically pleasing in appearance which is particularly desirable when the disk surfaces are externally visible, as is the case with many motor cycle brake disks (see FIG. 1). The grooves or channels around the island formations result in a significant reduction in the overall weight of the brake disk which in turn improves the efficiency and performance of the motor vehicle. Additionally, the channels allow for air flow around the island formations for increased cooling and heat dissipation. The base of each channel may be roughened or modulated to provide bumps or the like, creating turbulence in air flow along the channel which may produce enhanced cooling.

Island formations of the desired shape and dimensions may be formed in any suitable manner, for example by appropriate machining or other forming processes. After machining the desired island formations on one or both surfaces of the disk, the entire brake disk is coated with a wear and corrosion resistant coating 24 which eliminates or greatly reduces the wear of the island braking surfaces, as generally illustrated in FIG. 3A. Alternatively, the functional island braking surfaces alone may be coated with coating 24. The coating improves the overall look or aesthetics of the brake disk. In one embodiment, the coating includes a first layer of a metal, such as a pure titanium metal, and a second layer that includes a nitride, boride, carbide or oxide of the metal used in the first layer. The coating may be applied using a physical vapor deposition source such as a cathodic arc source with a controlled gas atmosphere. The materials used for coating 24 may be of different colors and may be designed to produce different surface appearances, such as a light reflective, shiny appearance, for example, particularly on regions of the surface which are visible when the brake disk is installed on a vehicle.

In one embodiment, a surface finish may be produced on the surfaces of the brake disk substrate, including the island formations, by blasting the brake disk surface with a continuous stream of particles (commonly referred to as bead blasting) which are typically harder than the brake disk surface. These particles can be round in shape or very irregular in shape. The various particle shapes impart a different surface finish or surface geography to the brake disk. For example, with round particles (of various sizes) and appropriate particle energy (air pressure or hydro pressure) a surface texture that microscopically resembles low soft rolling hills can be achieved. With irregular (crystalline) shaped particles, a very coarse surface geometry (very rugged/jagged peaks and valleys) can be imparted to the brake disk surface. Other methods such as a sanded or a ground surface finish can be used to give a different appearance when coated with the wear and corrosion resistant coating. When the sanded or ground surface finish is done in a cross-hatched configuration and then coated with the wear and corrosion resistant coating, the coated brake disk can be made to look as though it has a woven appearance such as is found in components made from carbon fiber. In general, there are a multitude of surface finish techniques that can be utilized to impart a specific surface texture or geometry into the brake disk prior to application of a coating 24. In one embodiment, selected surface finishes may be implemented as described in co-pending U.S. patent application Ser. No. 12/034,590 of Meckel filed on Feb. 20, 2008, the entire contents of which are incorporated herein by reference. In alternative embodiments, only the braking surfaces of the island formations may be treated to produce a surface texture, for example, by masking the channels between the island formations during bead blasting or other surface treatments.

Coating 24 is shown applied to a brake disk substrate 26 in FIGS. 3A and 3B. The brake disk substrate or rotor 26 may be formed of any suitable material such as cast iron, stainless steel, light weight metal alloys, ceramic materials, ceramic composite materials, or combinations thereof. The coating 24 may be implemented in one embodiment using the fixtures, techniques and materials as described in co-pending application Ser. No. 12/034,590 referenced above, and in co-pending U.S. patent application Ser. No. 12/034,599 of Meckel filed on Feb. 20, 2008, the entire contents of which are incorporated herein by reference. The portion of the substrate 26 illustrated in FIG. 3A may be part of the top surface of an island formation, or part of the channel between adjacent island formations. As noted above, the entire surface of the disk (island formations and valleys or channels between island formations) may be coated. In alternative embodiments, the island formations only may be coated.

As further shown in FIG. 3A, the coating 24 includes a first layer 28 of a material having an amorphous structure (i.e. a non-crystalline structure) or a crystalline structure. In a particular embodiment, the amorphous or crystalline material is a metal such as titanium, chromium, zirconium, aluminum, hafnium or an alloy thereof. The coating 24 further includes a second layer 30 that overlays and contacts the first layer 28. Though the layers are depicted as distinct, in some embodiments, the layers intermingle or merge such that no distinct boundary exists between the layers. The second layer 30 can include one or more binary metals, for example, one or more metal nitrides, metal borides, metal carbides and metal oxides. The second layer can include one or more nitrides, borides, carbides or oxides of the metal used in the first layer. In some embodiments, the coating may comprise multiple layers of alternating metal and metal compound materials may be applied in order to impart specific physical properties to the brake disk or rotor. In some embodiments of a coating 24, amorphous titanium constitutes the first layer 28 and a titanium nitride (TiN, Ti2N, etc.) constitutes the second layer 30. Multiple alternating layers 28, 30 can be configured to form a lattice structure or a super lattice structure. These are thin films formed by alternately depositing two different components to form layered structures. Multilayers become superlatices when the period of the different layers is less than 100 Å. With this cooperation of structure, a coating 24 having a service life to exceed approximately 100,000 vehicle miles or more can be obtained. Note: the abbreviations (e.g. TiN, Ti2N, etc.) are used herein as a shorthand rather than an exact chemical label, and do not suggest that the stoichiometry of the indicated compound must be exactly as stated in the abbreviation.

Figure 15:
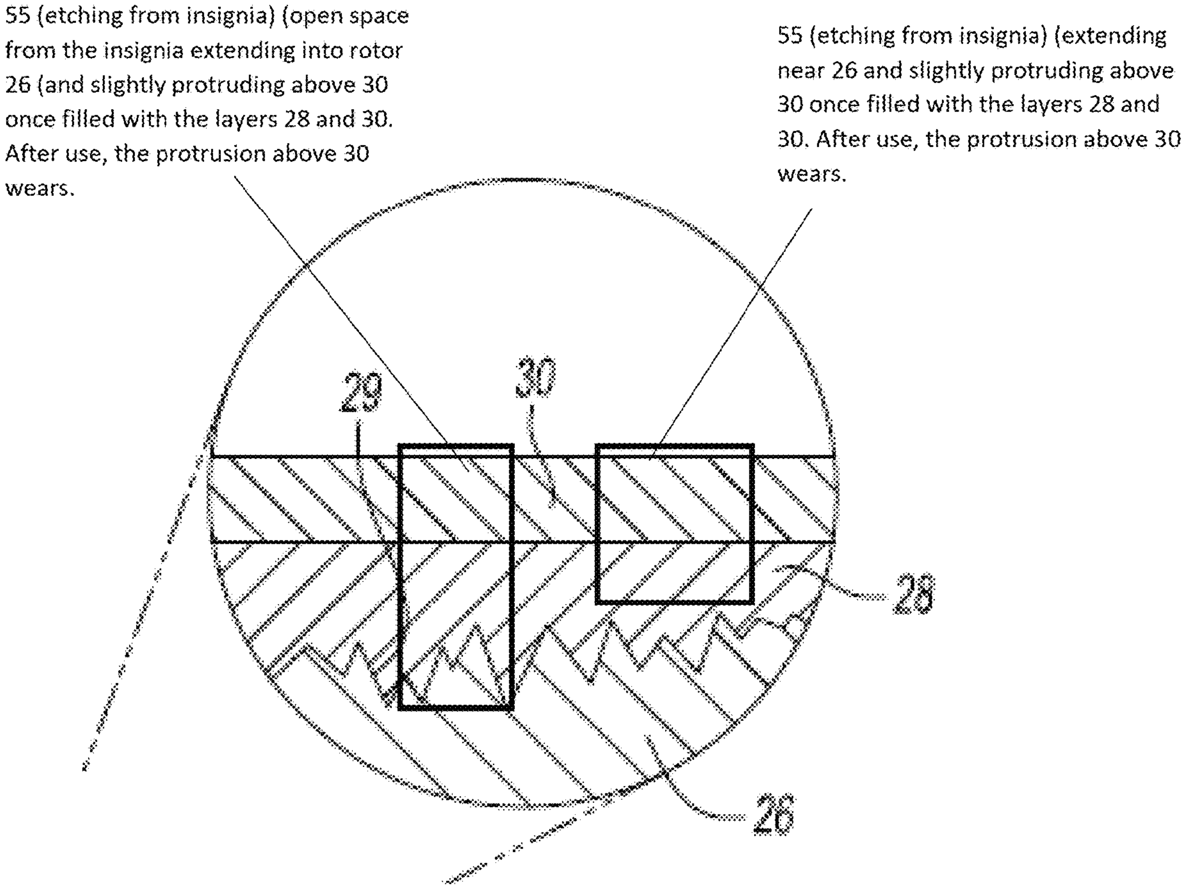
FIG. 15 illustrates placement of an etch logo (55) into the substrate and viewable on the working surface according to one or more methods shown or described herein.

FIG. 3B and FIG. 15 illustrate the optional addition of a surface texture 29 to the surface of substrate 26 prior to application of the coating layers 28 and 30. The surface texture in FIG. 3B is a coarse texture as may be imparted by blasting with irregular shaped particles, as described above, and comprises a series of peaks and valleys with angular apices at each peak and valley. Alternative surface textures may be rounded, cross-hatched, or woven in appearance, as described above. When the textured surface 29 is subsequently coated with one or more coating layers, the resultant, substantially flat surface can exhibit a three dimensional appearance or woven texture. In addition, the composition and thickness of the coating layers can be selected to achieve desired light reflection and absorption characteristics in order to produce an attractive ornamental appearance. Referring specifically to FIG. 15, an etched logo 55 is provided at a location within the layers 28 and 30. This etched section 55 is viewable to the user on the working surface as a form of insignia (logo, trademark, letters, words, serial numbers, designs, patters, artwork, and the like) and does not wear off in normal use because of the coating layers 28 and 30. Alternatively, the etching (or other slight indentation) may penetrate the substrate 26 while still being viewable in the finished product to display the insignia. Even further, the etching 55 may extend through the coating layers 28 and 30 and the substrate 26. In this particular embodiment, the substrate 26 includes a surface texture 29 (also a form of insignia) viewable to a person in the finished product. The etching of insignia (either at 55, the locations discussed herein, or at 29) is an improvement over the prior art when combined with the coatings 28 and 30 since the coatings 28 and 30 in connection with the substrate 28 create a working surface that prevents significant wear of the disc. As such, the insignia/etching 55, 29 remains visible throughout the life of the rotor.

Figure 5:
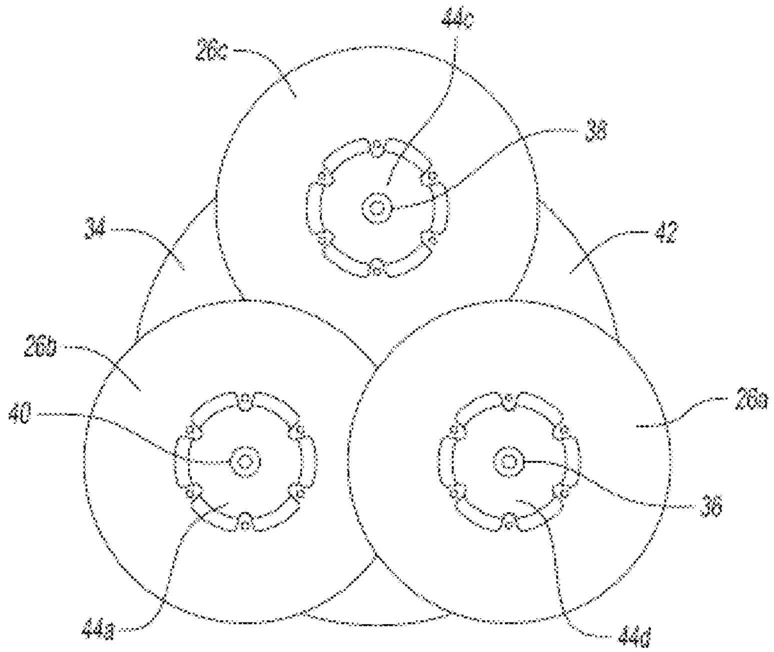
FIG. 5 is a top plan view of a fixture for supporting the disk brakes during the coating process according to one or more embodiments shown or described herein.

Referring now to FIGS. 4 and 5, a fixture 34 is shown for holding the brake disk substrates 26 during coating. Although not visible in FIGS. 4 and 5, the working surfaces of substrates 26 *a* to 26 *e* have plural raised projections or island formations as described above in connection with FIG. 9. Although the fixture 34 is shown holding five brake disk substrates 26 *a-e*, it is to be appreciated that the fixture 34 is merely exemplary and that fewer or more brake disk substrates 26 could be positioned on a fixture 34. As shown, the fixture 34 includes three parallel poles 36, 38, 40 that are mounted on and extend from a base plate 42. Although the fixture 34 only shows three parallel poles 36, 38, 40 it is appreciated that this configuration is only exemplary and that fewer or more parallel poles could be positioned on the fixture 34. The parallel poles 36, 38, 40 are arranged on the base plate 42 with each pole 36, 38, 40 spaced at an equal distance from the other two poles 36, 38, 40. With this cooperation of structure, a plurality of brake disk substrates 26 can be stacked on each pole 36, 38, 40. For example, as shown, brake disk substrates 26 *a* and 26 *d* are stacked on pole 36, brake disk substrate 26 *c* is stacked pole 38 and brake disk substrates 26 *b* and 26 *e* are stacked on pole 40.

As illustrated in FIGS. 4 and 5, spacers 44 *a-e* are used to selectively separate adjacent brake disk substrates 26 on each pole 36, 38, 40. For the implementation shown, each spacer 44 *a-e* includes a tube 46 and flange 48 allowing each spacer 44 *a-e* to be slid over a respective pole 36, 38, 40 and positioned as desired. In the implementation shown in FIGS. 4 and 5, the spacing between poles 36, 38 is established to allow the brake disk substrates 26 on one pole 36, 38, 40 to overlap the brake disk substrates 26 on an adjacent pole 36, 38, 40. Also for the implementation shown in FIGS. 4 and 5, the spacers 44 *a-e* have been sized to prevent brake disk substrates 26 on one pole 36, 38, 40 from contacting the brake disk substrates 26 on an adjacent pole 36, 38, 40.

Figure 6:
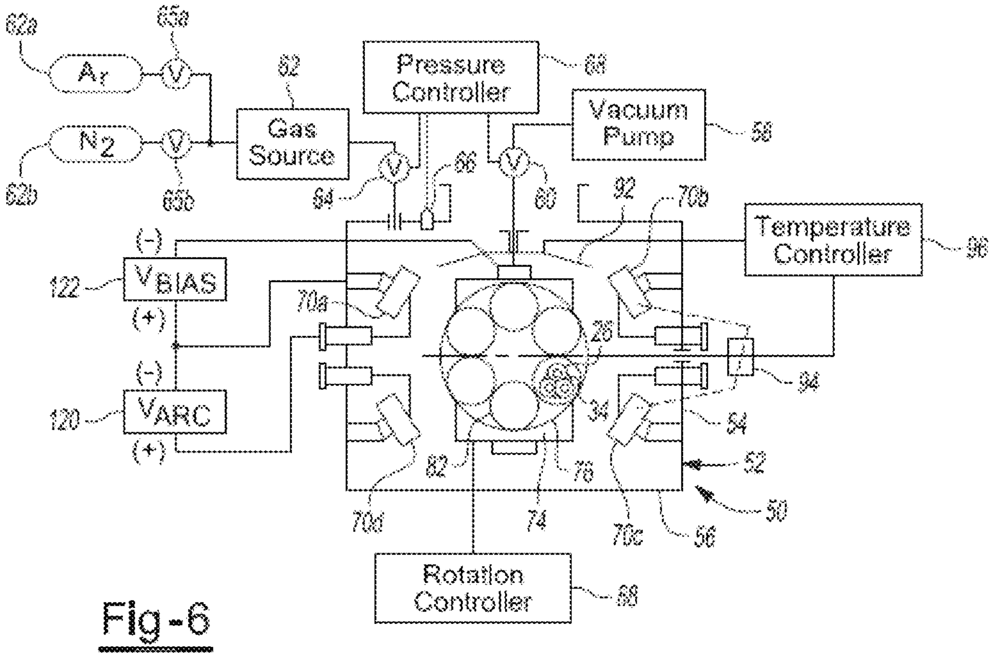
FIG. 6 is a schematic plan view and control diagram of a deposition apparatus for use in the coating process according to one or more embodiments shown or described herein.
Figure 7:
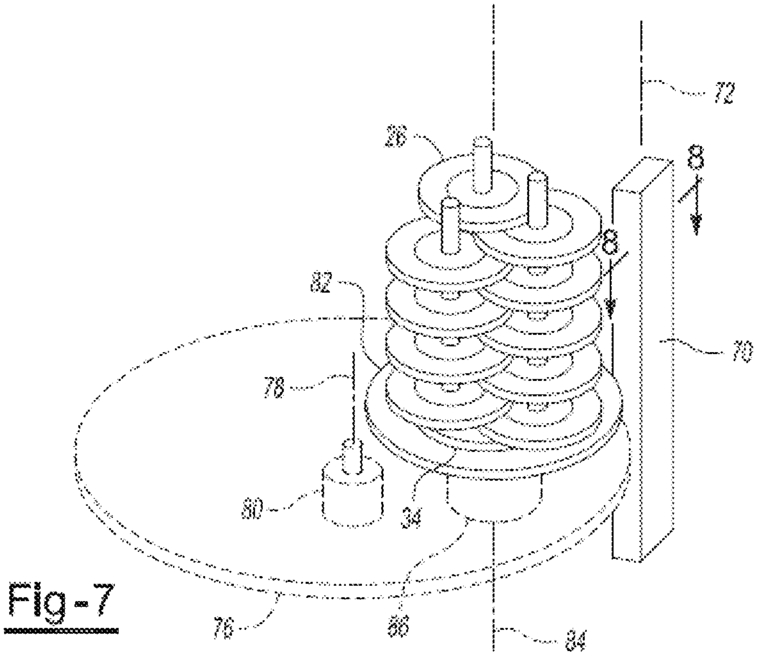
FIG. 7 is a schematic perspective view of a detail of the deposition apparatus of FIG. 5 according to one or more embodiments shown or described herein.

FIGS. 6 and 7 depict a deposition apparatus 50 for coating the brake disk substrates 26, although other operable deposition apparatus may be used. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 pumping through a gate valve 60. The vacuum pump 58 includes a mechanical pump and a diffusion pump operating together in the usual manner. The interior of the chamber 52 may be controllably backfilled to a partial pressure of a selected gas from a gas source 62 through a backfill valve 64. The gas source 62 typically includes several separately operable gas sources. The gas source 62 usually includes a source 62*a* of an inert gas such as argon and a source 62*b* of Nitrogen gas, each providing gas selectively and independently through a respective selector valve 65*a* or 65*b*. Other types of gas can also be provided as desired, such as gases required to produce borides, oxides and/or carbides.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gauge 66. Thus, the gaseous backfilled atmosphere within the chamber 52 is a flowing or dynamic atmosphere.

In the illustrated embodiment, four linear deposition sources 70 are mounted within the interior of the chamber 52 in a circumferentially spaced-apart manner. In alternative embodiments, a greater or lesser number of linear deposition sources may be used, with two or more deposition sources being used in each embodiment. In FIG. 6, the four deposition sources are identified as distinct sources 70 *a*, 70 *b*, 70 *c*, and 70 *d*, as addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate 26 during deposition procedures.

A support 74 is positioned in the chamber 52. The support 74 produces a compound rotational movement of a fixture 34 mounted thereon. In the illustrated embodiment, the support 74 includes a rotational carriage 76 that rotates about an axis 78, driven by a rotational drive motor 80 below the rotational carriage 76. Mounted on the rotational carriage 76 are six planetary carriages 82. In alternative embodiments, a greater or lesser number of planetary carriages may be used, such as one or more. The planetary carriages 82 are rotationally driven about a rotational axis 84 by a planetary drive motor 86 below the planetary carriages 82 (see FIG. 7). The speeds of the rotational drive motor 80 and the planetary drive motor 86 are controlled by a rotation controller 88. In one embodiment, the rotation controller 88 rotates the rotational carriage 76 at a rate of about 1 revolution per minute (rpm).

Continuing with FIGS. 6 and 7, for deposition processing of brake disk substrates 26, a fixture 34 as described above can be mounted on the planetary carriage 82, as shown. For commercial operations, a fixture 34 having a plurality of brake disk substrates 26 is mounted on each planetary carriage 82 in the manner described, as illustrated for one of the planetary carriages 82 in FIG. 7.

The temperature in the chamber 52 during deposition is controlled using a heater 92 that extends parallel to the deposition sources 70 on one side of the interior of the chamber 52. The heater 92 in one embodiment is a radiant heater operating with electrical resistance elements. The temperature of the heating array is monitored by a temperature sensor 94 such as an infrared sensor that views the interior of the chamber 52. The temperature measured by the sensor 94 is provided to a temperature control circuit 96 that provides the power output to the heater 92. Acting in this feedback manner, the temperature controller 96 allows the temperature of the heating array to be set. In the preferred processing, the heating array is heated to a temperature of from about 1000° F. to about 1700° F.

Figure 8:
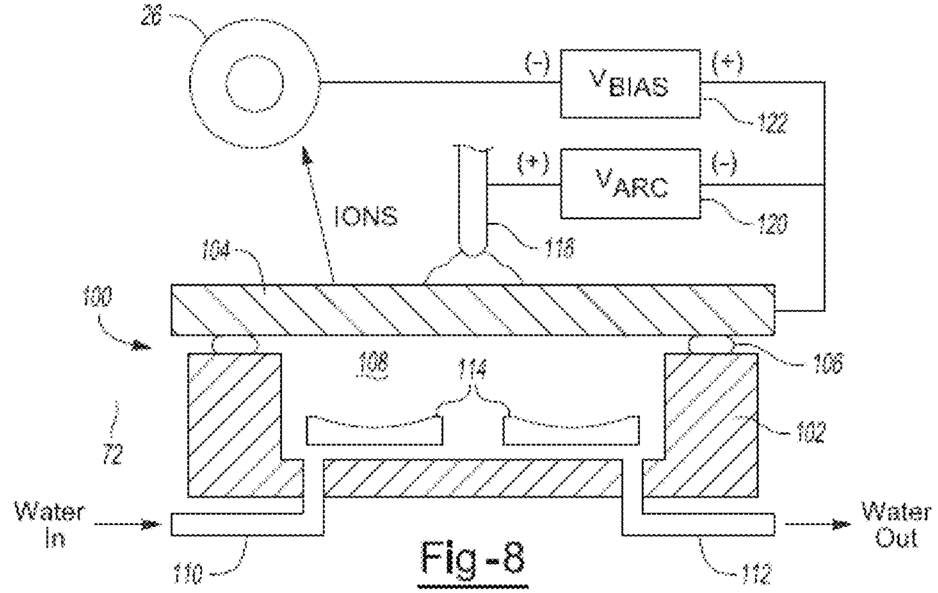
FIG. 8 is a schematic cross-sectional view of the cathodic arc source, taken along lines 8-8 of FIG. 7 according to one or more embodiments shown or described herein.

FIG. 8 illustrates a cathodic arc source 100 used in one embodiment of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two spirally shaped (only sections of the spirals are seen in FIG. 8) permanent magnets 114 extend parallel to the source axis 72. Positioned above the deposition target 104 exterior to the body 102 is a striker electrode 118. A voltage VARC is applied between the striker electrode 118 and the deposition target 104 by an arc source power supply 120. In one embodiment, VARC is in the range from about 10 to about 50 volts.

The metallic material that forms the deposition target 104 is deposited onto the brake disk substrate 26 together with, if desired, gas atoms producing gaseous species from the atmosphere of the chamber 52. For the embodiment describe herein, the deposition target 104 is made of Titanium (Ti) metal.

To accomplish the deposition, an arc is struck between the striker electrode 118 and the deposition target 104, locally heating the deposition target 104 and causing Titanium atoms and/or ions to be ejected from the deposition target 104. (The deposition target 104 is therefore gradually thinned as the deposition proceeds.) The striking point of the arc on the deposition target 104 moves in a racetrack course along the length of the deposition target 104. A negative bias voltage VBIAS is applied between the deposition target 104 and brake disk substrate 26 by a bias power supply 122, so that any positively charged ions are accelerated toward the brake disk substrate 26.

In one embodiment, VBIAS is in the range from about −30 to about −600 volts. The value selected for VBIAS determines the energy of ionic impact against the surface of the substrates, a phenomenon termed ion peening. In one case, VBIAS is initially selected to be a relatively large negative voltage to achieve good adherence of the metallic first layer 28 (see FIG. 3A) to the brake disk substrate 26. VBIAS is subsequently reduced (made less negative) when the overlying hard layer is deposited, to achieve a uniform, fine microstructure in the overlying layer. The values of VBIAS are desirably maintained as low as possible, consistent with obtaining an adherent coating 24. VBIAS is more positive than −600 volts, and in one embodiment is more positive than −400 volts. If VBIAS is too negative, corona effects and backsputtering may occur at some regions of the brake disk substrate 26. Thus, while higher VBIAS voltages may be used in some instances, generally it is preferred that VBIAS be more positive than −600 volts. The cathodic arc source 100 is preferred, but other types of sources, such as sputtering sources, may also be used.

The cooperative selection of the material of the deposition target 104 and the gases introduced into the deposition chamber 52 from the gas source 62 allows a variety of coatings 24 to be deposited onto the brake disk substrate 26, within the constraints discussed previously. The total thickness of the coating 24 in one embodiment is in the range from about 1 to about 10 micrometers. If the coating thickness is less than about 1 micrometer, the physical properties of the coating 24 are insufficient to produce the desired results. If the coating thickness is more than about 10 micrometers, the coating 24 has a high internal stress that leads to a tendency for the coating 24 to crack and spall away from the brake disk substrate 26 during deposition or during service.

These general principles are applied in preparing the coatings 24 of interest, as described previously in relation to FIG. 3A. The coating 24 of FIG. 3A includes an amorphous metallic first layer 28, such as amorphous metallic Titanium, that contacts and overlays the surface of the brake disk substrate 26. The amorphous metallic first layer 28 is deposited by backfilling the deposition chamber 52 with a small partial pressure of about 5 microns of an inert gas, such as flowing argon (flowing at a rate of about 200-450 standard cubic centimeters per minute (sccm) in the apparatus used by the inventors), and then depositing metal, such as Titanium, from the deposition target 104 with VBIAS about −400 volts. Because the argon does not chemically react with the metal, an amorphous metallic first layer 28 is deposited.

As shown in FIG. 3A, a second layer 30, which for the embodiment described herein is a metal Nitride, overlies the amorphous metallic first layer 28. The second layer 30 is deposited by backfilling the deposition chamber 52 with a small partial pressure of about 5 microns of flowing Nitrogen (flowing at a rate of about 150-500 standard cubic centimeters per minute in one embodiment), and then depositing metal, such as Titanium, from the deposition target 104 with VBIAS about −50 volts. The metal combines with the Nitrogen to produce the metal Nitride in the second layer 30.

The island formations or raised land portions on the brake disks described above facilitate cooling of the brake disk by increasing and directing air flow around and between the island formations during braking. By increasing the ability of the brake disk to dissipate heat, the risk of brake fade, wear and warpage is reduced, and may potentially increase the effective service life of the brake disk. In addition, the voids or channels between adjacent island formations reduce the overall weight of the brake disk, reducing the amount of material required. Finally, the island formations can be designed to produce a visually attractive appearance in the visible portion of the brake disk, adding to the overall look of a vehicle such as a motor cycle where the brake disks are clearly visible.

Although the embodiments described above are in the form of brake discs, in other embodiments the island formations could alternatively be applied to working surfaces of other brake components for frictional engagement with a braking member, such as the surface of a brake drum which is engaged by a brake shoe in a drum brake arrangement.

Figure 10:
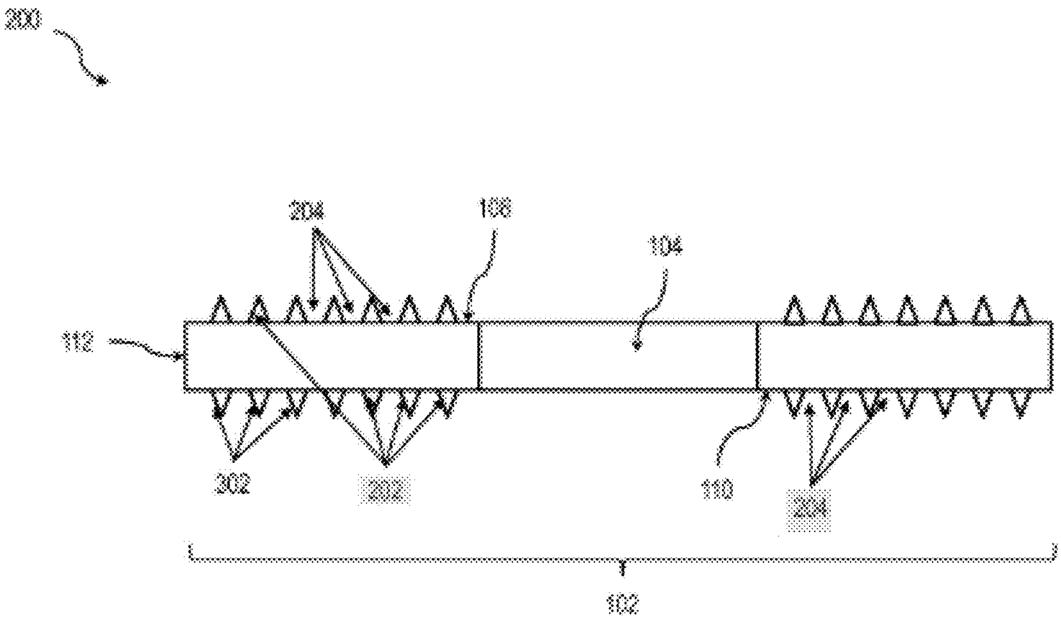
FIG. 10 shows a diagram showing a cross-sectional view of a brake rotor having surface roughness features according to one or more methods shown or described herein.
Figure 11:
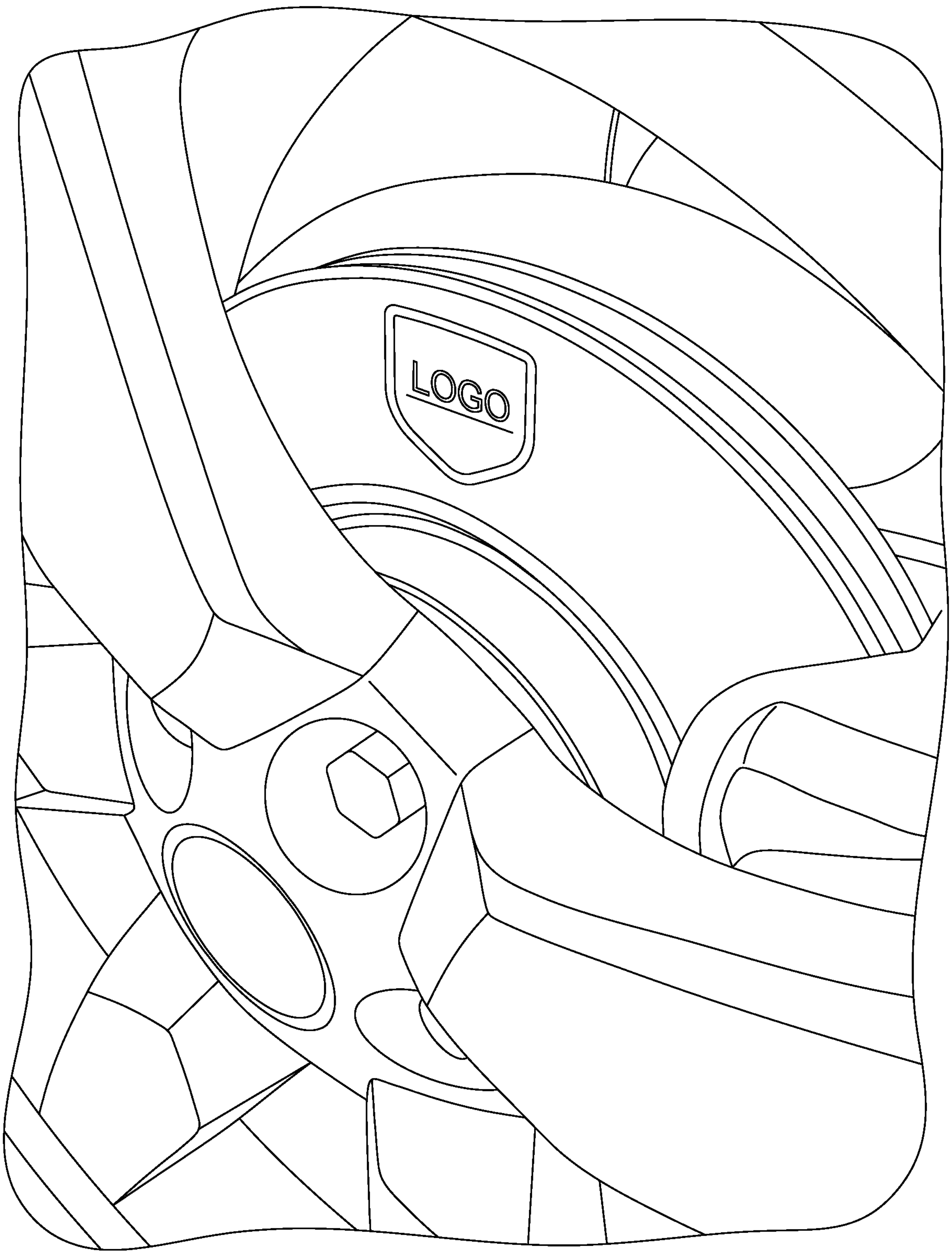
FIG. 11 is a photographic perspective view of insignia applied to a brake rotor according to one or more methods shown or described herein.
Figure 12:
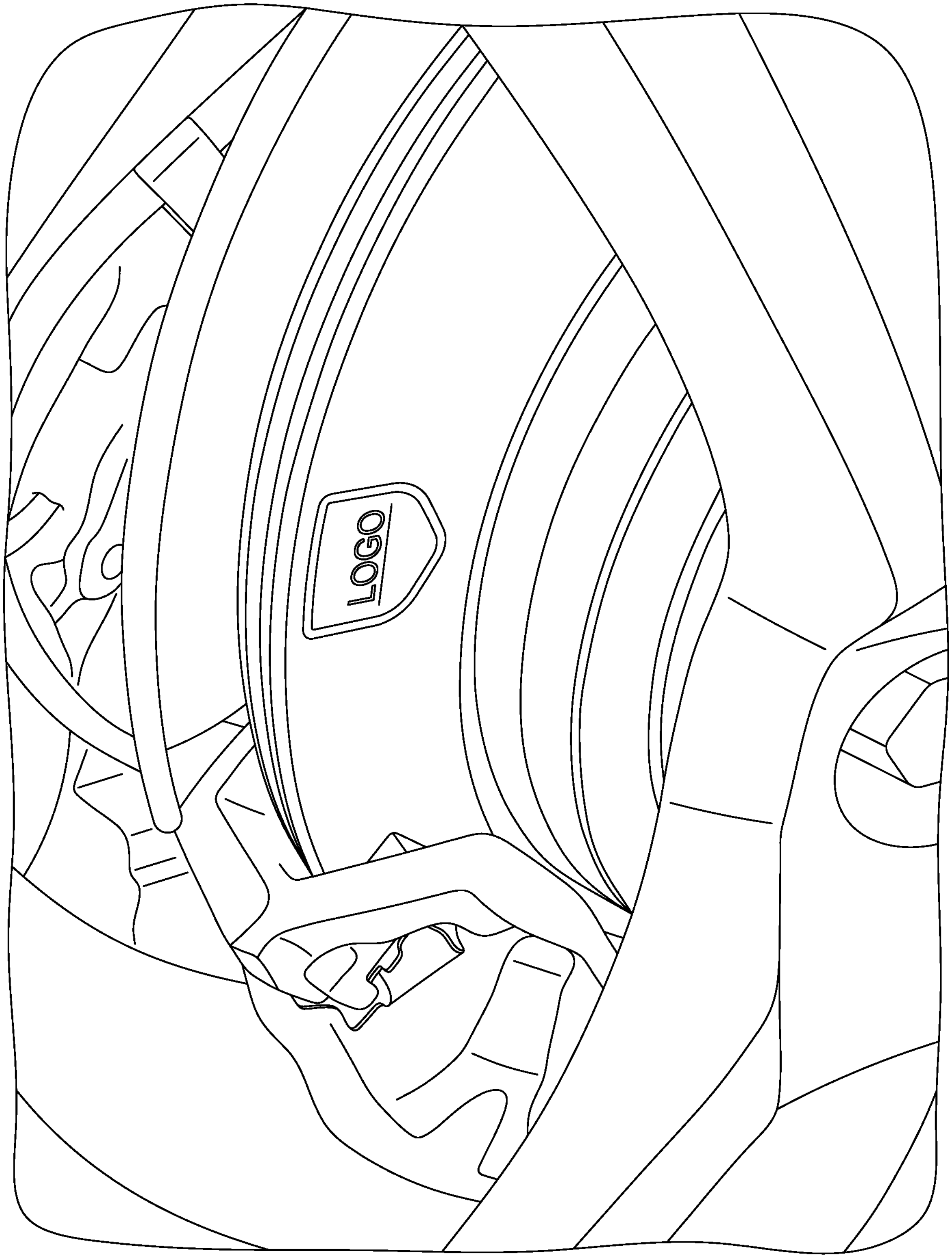
FIG. 12 is a photographic perspective view of insignia applied to a brake rotor according to one or more methods shown or described herein.
Figure 13:
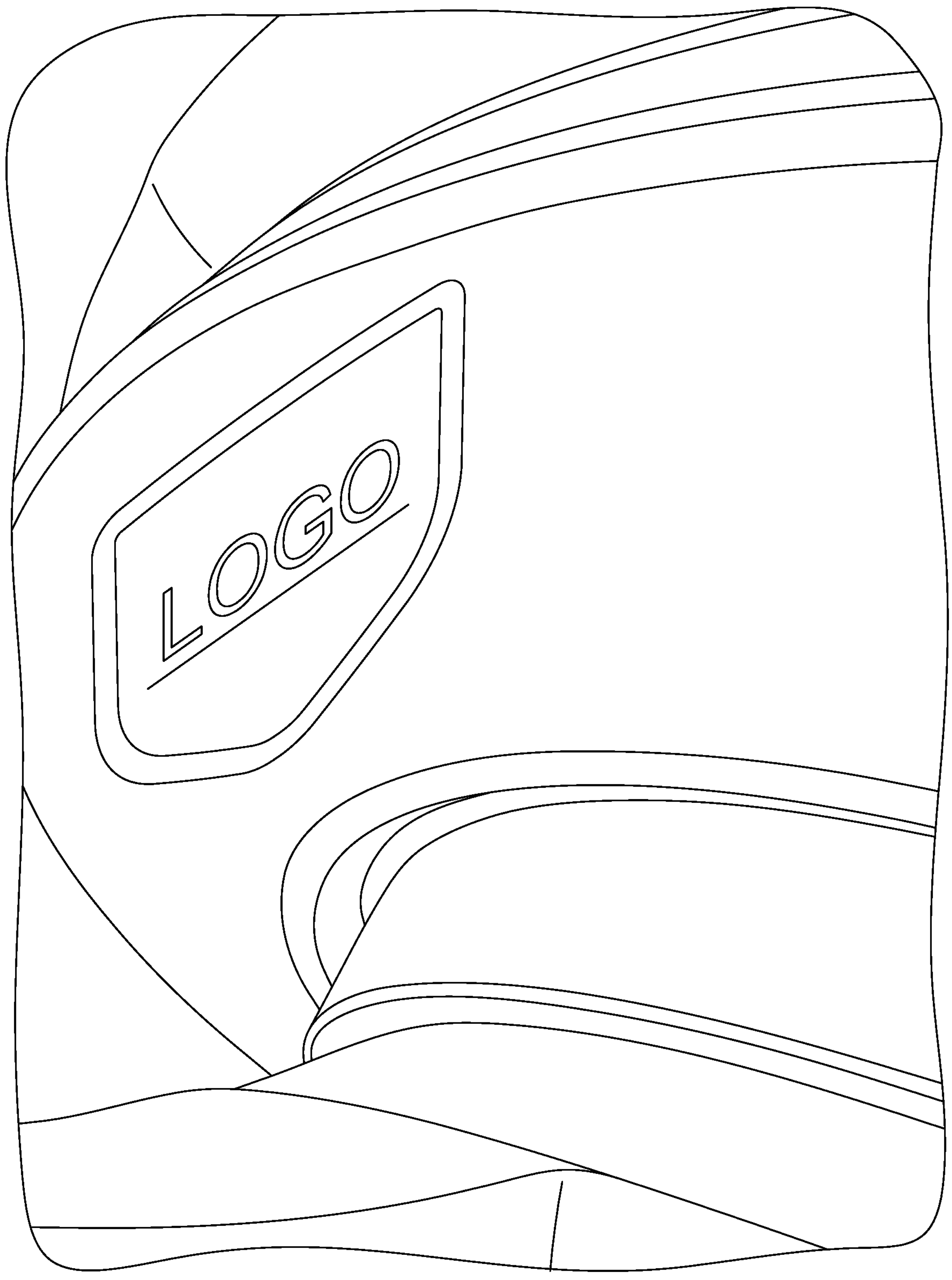
FIG. 13 is a photographic perspective view of insignia applied to a brake rotor according to one or more methods shown or described herein.

Referring now to FIG. 10, as shown in the cross-sectional diagram 200 of a brake rotor 102 in FIG. 2, the friction surfaces disposed on the opposing annular surfaces 108 and 110 of the brake rotor 102 can in some implementations include surface roughness features that can take the form of a plurality of raised "peaks" or island formations 202 with spaced "valleys" or air flow channels 204 between the island formations peaks. Only the peaks 202 generally contact the friction material 114 of the brake pad 116 during engagement of the braking system 100. A uniform pattern can be used throughout the friction surface of an annular surface 108 or 110 of a brake rotor 102. Alternatively or in addition, a combination of different shaped surface features can be included to present a visible design or texture that can vary in a random or predetermined manner across either or both annular surfaces 108, 110. The peaks 202 can include tear drop shaped formations, circle or dot shaped formations, figure eight shaped formations, letter shaped formations, and the like, with valleys 204 between and/or around the peaks 202.

The peaks 202 can have sharp, angular cross-sectional shapes as illustrated in FIG. 2. Other shapes of the peaks 202 and valleys 204 are also within the scope of this disclosure. Shapes of the peaks 202 can include, but are not limited to squares, trapezoids, rectangles, triangles, stars, letters or names, numbers, logos, trademarks, dashes, other geometric shapes, and the like, with or without rounded corners. The shape and positioning of the peaks 202 can be designed to be aesthetically pleasing in appearance, which is particularly desirable when the annular surfaces 108 and 110 are externally visible, as is the case with many motor cycle brake rotors. The valleys 204 adjacent to an/or surrounding the peaks 202 can result in a significant reduction in the overall weight of the brake rotor 102 which in turn can improve the efficiency and performance of the motor vehicle. Additionally, the valleys 204 can allow for air flow around the peaks 202 for increased cooling and heat dissipation. The base of each valley 204 can optionally be roughened or modulated to provide bumps or the like that create turbulence in air flow along the valley 204 which can also improve the cooling effect.

Peaks 202 of desired shapes and dimensions can be formed in any suitable manner, for example by appropriate machining or other forming processes. After forming peaks 202, valleys 204, and/or other surface roughness features on one or both annular surfaces 108, 110 of the brake rotor 102, the annular surface 108, 110 of the brake rotor 102 can be coated with a wear and corrosion resistant coating that eliminates or greatly reduces the rate at which the peaks 202 are worn down by contact with the friction material 114 of a brake pad. The wear and corrosion resistant coating can be deposited on the surfaces of the peaks 202 and also optionally in the valleys 204. The wear and corrosion resistant coating can improve the overall look or aesthetics of the brake rotor 102 while also substantially increasing its hardness relative to an uncoated brake rotor friction surface.

Figure 14:
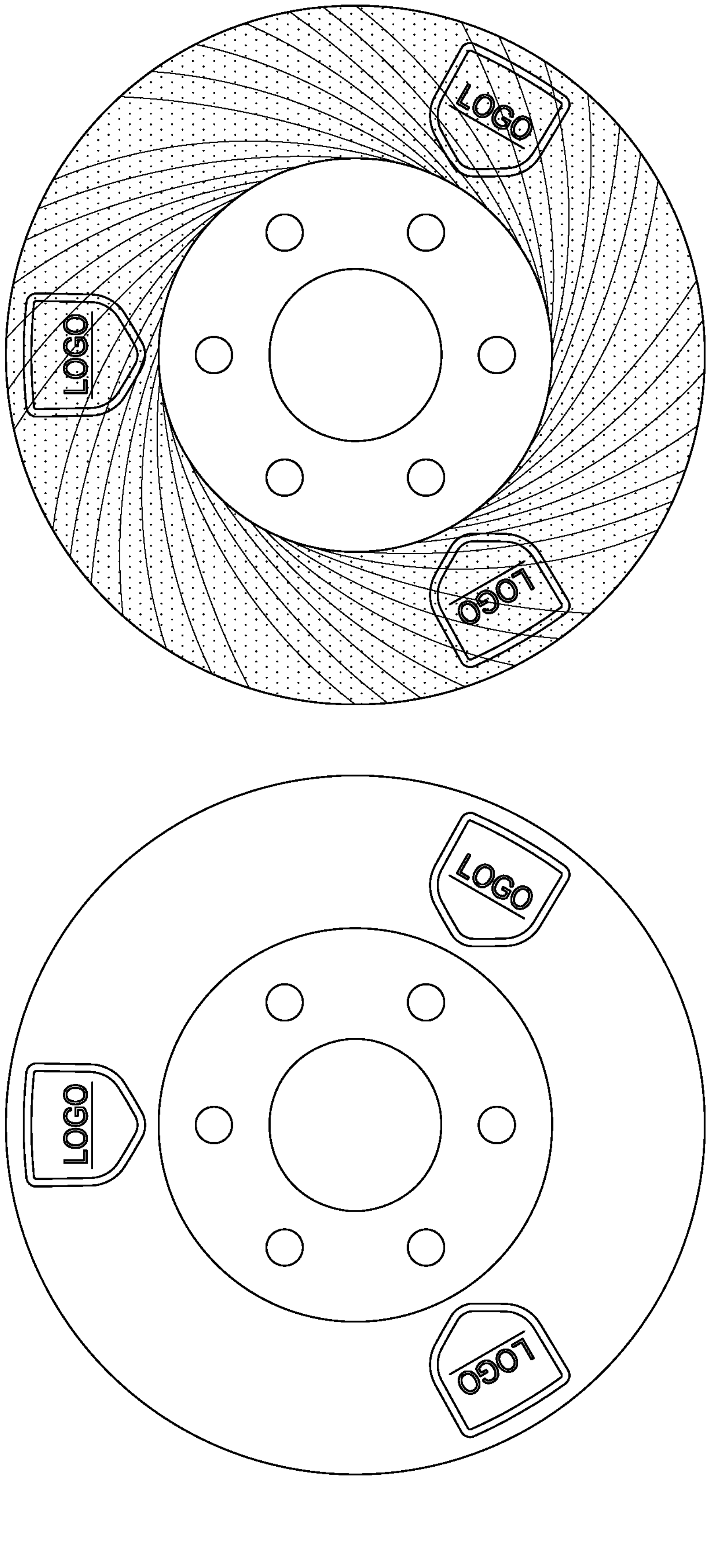
FIG. 14 is a photographic perspective view of insignia applied to a brake rotor both before and after wear (100-300 miles) according to one or more methods shown or described herein.

By employing various engraving processes (laser, chemically etching, machining, grinding, roll stamping etc.) for example one can impart insignia (marks, logos, trademarks, patterns, words, numbers, letters, shapes, designs, and the like) onto/into the working surface of the brake rotor. When protected with the aforementioned protection, the insignia can be rendered permanent. When the brake pad is pressed against the working surface of the brake rotor a uniform transfer layer of the brake pad material is established onto/into the brake rotor working surface. As the transfer layer develops the areas that are marked receive a somewhat thicker layer due to the depression created by the laser etching process. This typically results in a very prominent appearance of the pattern/shape/design of the marked area (as demonstrated by the darkening of the logos in FIG. 14).

Although the embodiments of the present invention have been illustrated in the accompanying drawings and described in the foregoing detailed description, it is to be understood that the present invention is not to be limited to just the embodiments disclosed, but that the invention described herein is capable of numerous rearrangements, modifications and substitutions without departing from the scope of the claims hereafter. The claims as follows are intended to include all modifications and alterations insofar as they come within the scope of the claims or the equivalent thereof.

It is noted that the terms "substantially" and "about" may be utilized herein to represent the inherent degree of uncertainty that may be attributed to any quantitative comparison, value, measurement, or other representation.

These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter.

Unless otherwise stated, any numerical values recited herein include all values from the lower value to the upper value in increments of one unit provided that there is a separation of at least 2 units between any lower value and any higher value. As an example, if it is stated that the amount of a component, a property, or a value of a process variable such as, for example, temperature, pressure, time and the like is, for example, from 1 to 90, preferably from 20 to 80, more preferably from 30 to 70, it is intended that intermediate range values such as (for example, 15 to 85, 22 to 68, 43 to 51, 30 to 32 etc.) are within the teachings of this specification. Likewise, individual intermediate values are also within the present teachings. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the Detailed Description of the Invention of a range in terms of at "'x' parts by weight of the resulting polymeric blend composition" also contemplates a teaching of ranges of same recited amount of "x" in percent by weight of the resulting polymeric blend composition."

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The term "consisting essentially of" to describe a combination shall include the elements, ingredients, components, or steps identified, and such other elements ingredients, components or steps that do not materially affect the basic and novel characteristics of the combination. The use of the terms "comprising" or "including" to describe combinations of elements, ingredients, components, or steps herein also contemplates embodiments that consist essentially of, or even consist of the elements, ingredients, components or steps.

Plural elements, ingredients, components, or steps can be provided by a single integrated element, ingredient, component or step. Alternatively, a single integrated element, ingredient, component, or step might be divided into separate plural elements, ingredients, components or steps. The disclosure of "a" or "one" to describe an element, ingredient, component, or step is not intended to foreclose additional elements, ingredients, components or steps. All references herein to elements or metals belonging to a certain group refer to the Periodic Table of the Elements published and copyrighted by CRC Press, Inc., 1989. Any reference to the group or groups shall be to the group or groups as reflected in this Periodic Table of the Elements using the IUPAC system for numbering groups.

While particular embodiments have been illustrated and described herein, it should be understood that various other changes and modifications may be made without departing from the spirit and scope of the claimed subject matter.

Moreover, although various aspects of the claimed subject matter have been described herein, such aspects need not be utilized in combination.

It is therefore intended that the appended claims (and/or any future claims filed in any utility application) cover all such changes and modifications that are within the scope of the claimed subject matter.

Moreover, although various aspects of the claimed subject matter have been described herein, such aspects need not be utilized in combination.

It is therefore intended that the appended claims cover all such changes and modifications that are within the scope of the claimed subject matter.

The invention claimed is:

1. A method comprising:

surface finishing at least a portion of two parallel surfaces of a brake disk to impart a predetermined three-dimensional surface texture having peaks, valleys and angular surfaces between the peaks and valleys to at least the portion of the two parallel surfaces;

etching insignia onto at least one of the surfaces of the brake disk;

applying a first material to an area comprising at least the portion of the parallel surfaces through vapor deposition, wherein the first material is deposited onto the area by energizing a first material source to cause charged particles of the first material source to be dissociated from the first material source and deposited on the area; and applying a second compound to the area through vapor deposition, the applying comprising energizing a second material source to cause charged particles of the second material source to be dissociated from the second material source, and reacting a reactive gas with the charged particles of the second material to form the second compound applied to the area;

wherein the combination of the surface finishing and the applying of the first material and the second compound causes the area of the brake disk to exhibit the predetermined three dimensional surface texture after applying the first material and the second compound.

2. A method comprising:

surface finishing at least a portion of two parallel surfaces of a brake disk to impart a predetermined three dimensional surface texture having peaks, valleys and angular surfaces between the peaks and valleys to at least the portion of the two parallel surfaces;

applying insignia onto at least one of the surfaces of the brake disk;

applying a first material to an area comprising at least the portion of the parallel surfaces through vapor deposition, wherein the first material is deposited onto the area by energizing a first material source to cause charged particles of the first material source to be dissociated from the first material source and deposited on the area; and applying a second compound to the area through vapor deposition, the applying comprising energizing a second material source to cause charged particles of the second material source to be dissociated from the second material source, and reacting a reactive gas with the charged particles of the second material to form the second compound applied to the area;

wherein applying insignia to the at least one surface of the brake disk is done by means of etching, paint, or indentation;

wherein the combination of the surface finishing and the applying of the first material and the second compound causes the area of the brake disk to exhibit the predetermined three dimensional surface texture after applying the first material and the second compound.

* * * * *